(12) United States Patent
Tsunetsugu

(10) Patent No.: US 9,837,969 B2
(45) Date of Patent: Dec. 5, 2017

(54) TRANSIMPEDANCE CIRCUIT

(71) Applicant: KABUSHIKI KAISHA TOSHIBA, Tokyo (JP)

(72) Inventor: Yukio Tsunetsugu, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 163 days.

(21) Appl. No.: 14/819,186

(22) Filed: Aug. 5, 2015

(65) Prior Publication Data

US 2016/0268975 A1 Sep. 15, 2016

(30) Foreign Application Priority Data

Mar. 9, 2015 (JP) .................... 2015-046300

(51) Int. Cl.
*H03F 3/08* (2006.01)
*H03F 1/32* (2006.01)
*H03F 3/343* (2006.01)

(52) U.S. Cl.
CPC ............ *H03F 1/3205* (2013.01); *H03F 3/08* (2013.01); *H03F 3/082* (2013.01); *H03F 3/3435* (2013.01); *H03F 2200/78* (2013.01)

(58) Field of Classification Search
CPC ...... H03F 1/3205; H03F 3/3435; H03F 3/082; H03F 2200/78
See application file for complete search history.

(56) References Cited

U.S. PATENT DOCUMENTS

2016/0061658 A1* 3/2016 Sugizaki ............... H03F 1/086
250/551
2016/0268982 A1* 9/2016 Sugizaki ............... H03F 3/082

FOREIGN PATENT DOCUMENTS

JP H0282804 A 3/1990

* cited by examiner

*Primary Examiner* — Tony Ko
(74) *Attorney, Agent, or Firm* — Patterson & Sheridan, LLP

(57) ABSTRACT

According to one embodiment, a transimpedance circuit includes: a transimpedance amplifier that converts a current signal into a voltage signal, a reference voltage generating circuit that generates a reference voltage signal, and a comparator that generates a pulse signal corresponding to the current signal in accordance with a voltage level of the voltage signal and a voltage level of the reference voltage signal. The transimpedance amplifier includes a first transistor that amplifies the current signal, a voltage converter that converts the current signal into a voltage signal, and a bypass circuit that allows the current signal to be bypassed when the current signal which flows through a control terminal of the first transistor exceeds a predetermined value.

8 Claims, 7 Drawing Sheets

TRANSIMPEDANCE CIRCUIT

CROSS-REFERENCE TO RELATED APPLICATION

This application is based upon and claims the benefit of priority from Japanese Patent Application No. 2015-046300, filed Mar. 9, 2015, the entire contents of which are incorporated herein by reference.

FIELD

An embodiment described herein relates to a transimpedance circuit for converting a current signal into a voltage signal.

BACKGROUND

A photodiode generates a current signal corresponding to a received optical signal. The current signal is converted into a voltage signal by a transimpedance circuit, and thereafter, a pulse signal is generated. In general, the larger the amount of light the photodiode receives, the larger the electric current signal the photodiode produces.

However, in an initial-stage transistor circuit mounted in the inside of the transimpedance circuit, when a current signal produced from a photodiode is increased, the initial-stage transistor circuit may become saturated. When the initial-stage transistor circuit is saturated, distortion is generated in the voltage signal and hence, a finally output pulse signal is also distorted.

DETAILED DESCRIPTION

According to an example embodiment, there is provided a transimpedance circuit which reduces distortion in a pulse signal even when a current signal is large.

In general, according to one embodiment, a transimpedance circuit includes: a transimpedance amplifier that converts a current signal into a voltage signal; a reference voltage generating circuit that generates a reference voltage signal; and a comparator that generates a pulse signal corresponding to the current signal in accordance with a voltage level of the voltage signal and a voltage level of the reference voltage signal. The transimpedance amplifier includes: a first transistor that amplifies the current signal; a voltage converter that converts the current signal into a voltage signal; and a bypass circuit that allows the current signal to be bypassed when the current signal which flows through a control terminal of the first transistor exceeds a predetermined value.

Hereinafter, an example embodiment is explained by reference to the drawings. In the embodiment explained hereinafter, the explanation is made by mainly focusing on the characteristic configuration and the characteristic manner of operation in an exemplary transimpedance circuit. However, a transimpedance circuit may include additional elements and/or variations in configuration or manner of operation known to those of ordinary skill in the art which are omitted for purposes of clarity in the explanation of example embodiments made hereinafter. However, these omitted elements, configurations, and manner of operation also fall within the scope of this disclosure.

Figure 1:
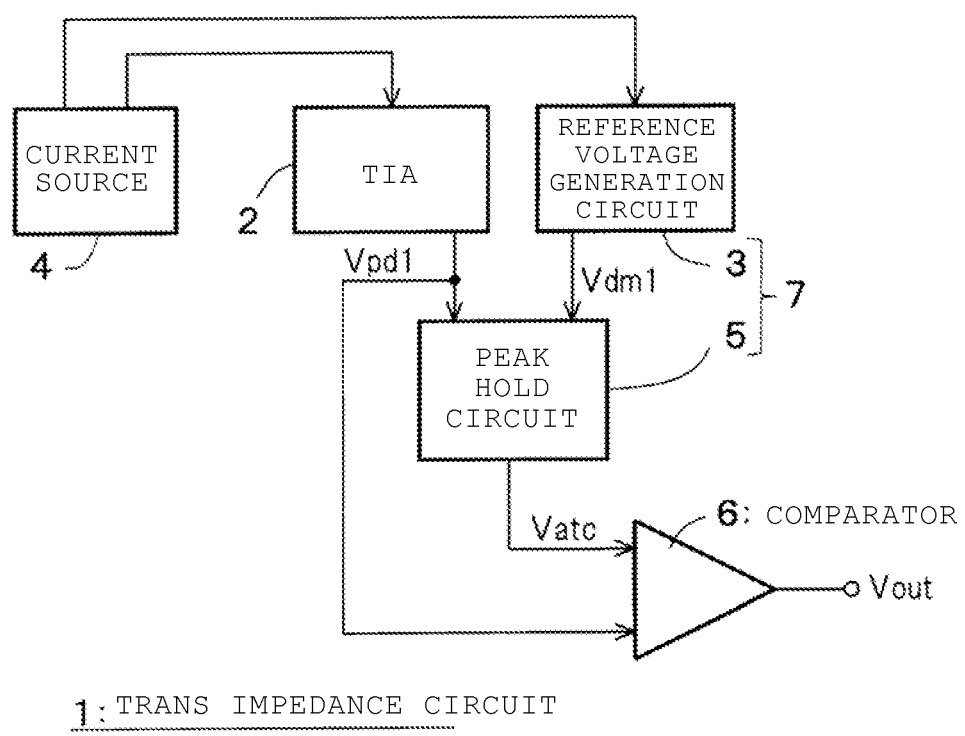
FIG. 1 depicts a block diagram of a transimpedance circuit according to an example embodiment.

FIG. 1 depicts a block diagram of a transimpedance circuit 1 according to an example embodiment. The transimpedance circuit 1 shown in FIG. 1 includes: a transimpedance amplifier (TIA) 2, a reference voltage generation circuit (dummy circuit) 3, a current source 4, a peak hold circuit 5, and a comparator 6.

The transimpedance amplifier 2 converts a current signal Ipd into a voltage signal Vpd1. Usually, the transimpedance amplifier 2 converts a current signal Ipd generated from a light receiving element such as a photodiode into a voltage signal Vpd1. The light receiving element may be arranged inside the transimpedance amplifier 2 or outside the transimpedance amplifier 2. The light receiving element generates and outputs a current signal Ipd of a magnitude corresponding to a light intensity of an optical signal which the light receiving element receives.

The reference voltage generation circuit 3 has a similar or substantially the same circuit configuration as the transimpedance amplifier 2 and generates a reference voltage signal Vdm1. The reference voltage generation circuit 3 is provided to minimize the influence on the transimpedance circuit caused by environmental noise such as common mode noise, irregularities in characteristics of the respective circuit elements in the transimpedance amplifier 2 and the like. More specifically, a voltage signal Vpd1 which the transimpedance amplifier 2 generates is approximately several tens of millivolts (mV) so that the transimpedance circuit 1 is subject to the influence of environmental noise and irregularities in element characteristics. Accordingly, by comparing a voltage signal Vpd1 generated from the transimpedance amplifier 2 with a reference voltage signal Vdm1 generated from the reference voltage generation circuit 3, which has the same (or similar) circuit configuration as the transimpedance amplifier 2, fluctuations contained in both signals respectively, due to environmental noise or the like, can be used to offset each other.

The current source 4 generates a reference current which is used in common by the transimpedance amplifier 2 and the reference voltage generation circuit 3. Although the configuration of the current source 4 is not specifically limited, it is desirable that the current source 4 be configured such that an electric current supplied from the current source 4 is adjustable.

The peak hold circuit 5 generates an intermediate voltage level signal using a voltage signal Vpd1 generated by the transimpedance amplifier 2 and a reference voltage signal Vdm1 generated by the reference voltage generation circuit 3. The reason that the peak hold circuit 5 is used to generate such an intermediate voltage level signal is that a signal distortion is generally the smallest at an intermediate voltage level. The peak hold circuit 5 also incorporates an offset adjustment circuit therein. The offset adjustment circuit outputs a signal acquired by adding a predetermined offset voltage to the intermediate voltage level signal as a final reference voltage signal Vatc so as to prevent an erroneous determination where a voltage signal Vpd1 is larger than the reference voltage signal, when the light receiving element in the transimpedance amplifier 2 is not receiving an optical signal.

A reference voltage output circuit may be formed by combining the reference voltage generation circuit 3 and the peak hold circuit 5. The peak hold circuit 5 may be omitted in some cases. In such cases, the reference voltage output circuit becomes a circuit equivalent to the reference voltage generation circuit 3.

The comparator 6 generates a pulse signal Vout which is a binary (digital) signal indicating whether or not a voltage signal Vpd1 generated from the transimpedance amplifier 2 exceeds the reference voltage signal Vatc which the peak hold circuit 5 holds. In the comparator 6, a voltage signal Vpd1 and a reference voltage signal Vatc may be compared with each other or corresponding voltage signals may be obtained by changing a voltage signal Vpd1 and a reference voltage signal Vatc and these corresponding voltage signals may be compared with each other. That is, the comparator 6 can compare a voltage signal correlated with a voltage signal Vpd1 and a voltage signal correlated with a reference voltage signal Vatc, and generates a pulse signal Vout according to the comparison result obtained using the correlated voltage signals rather than a comparison result obtained by directly comparing the voltage signal Vpd1 to the reference voltage signal Vatc.

Figure 2:
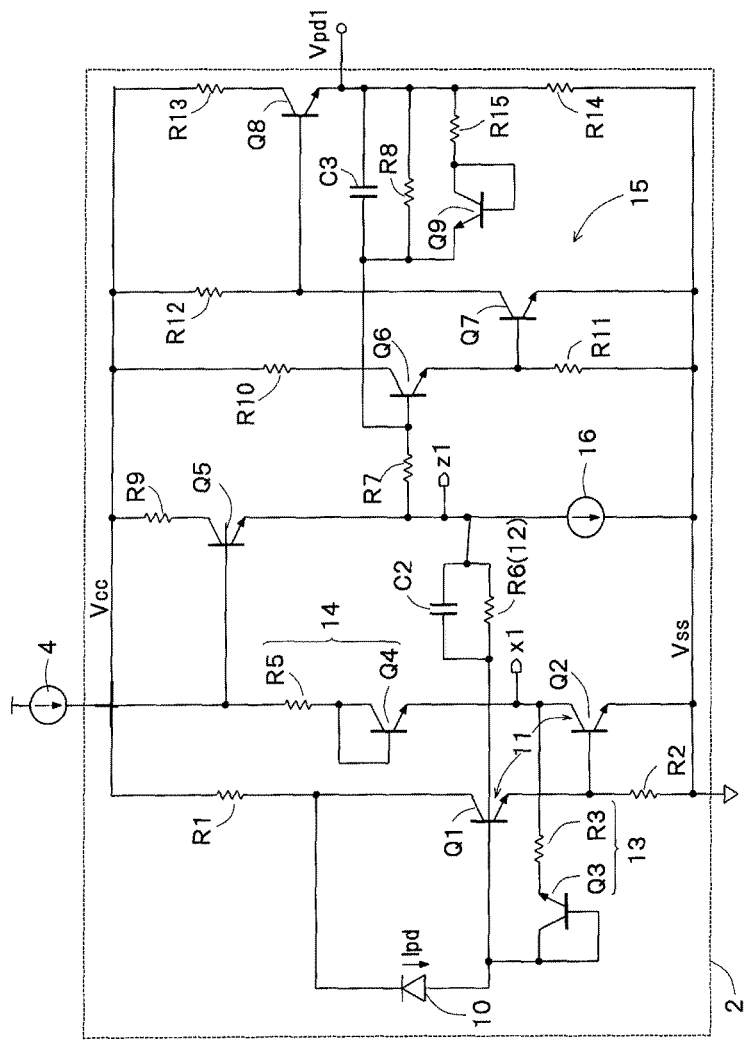
FIG. 2 depicts a circuit diagram showing one example of an internal configuration of a transimpedance amplifier.

FIG. 2 depicts a circuit diagram showing one example of the internal configuration of the transimpedance amplifier 2 shown in FIG. 1. Hereinafter, the explanation is made with respect to an example where a light receiving element, which is internally mounted in or externally mounted on the transimpedance amplifier 2, is a photodiode 10. The transimpedance amplifier 2 depicted in FIG. 2 includes: an initial-stage transistor (first transistor) circuit 11 which amplifies a current signal Ipd from the photodiode 10; a voltage converter 12 which converts a current signal amplified by the initial-stage transistor circuit 11 into a voltage; a bypass circuit 13 through which the current signal Ipd is bypassed when an electric current, which flows towards a base (control terminal) of the initial-stage transistor circuit 11, exceeds a predetermined value; and an inverting amplifier 15 which inverts and amplifies a voltage signal outputted from the voltage converter 12.

Each transistor in the transimpedance amplifier 2 depicted in FIG. 2 is a bipolar transistor. For example, the initial-stage transistor circuit 11 includes two npn transistors Q1, Q2 which are connected in a Darlington configuration. A base of the transistor Q1 is connected to an anode of the photodiode 10. A collector of the transistor Q1 is connected to a power source voltage node Vcc via a resistance element R1. The emitter of the transistor Q1 is connected to a ground node Vss via a resistance element R2. The emitter of the transistor Q1 is connected to the base of the transistor Q2, to form the Darlington configuration. An emitter of the transistor Q2 is grounded.

The bypass circuit 13 is connected between a collector of the transistor Q2 and the anode of the photodiode 10. The bypass circuit 13 includes an npn transistor (second transistor) Q3 connected as a diode, and a resistance element R3 connected in series with the diode-connected transistor Q3. The resistance element R3 is a current-limiting resistance element. As described later, the resistance element R3 may be omitted when the transimpedance amplifier 2 is implemented with MOS transistors.

The base and collector of the transistor Q3 are connected to the anode of the photodiode 10, an emitter of the transistor Q3 is connected to one end of the resistance element R3, and the other end of the resistance element R3 is connected to the collector of the transistor Q2.

When the photodiode 10 is externally mounted (outside the transimpedance amplifier 2), a resistance element and a capacitor can be connected in series to conform to an electric characteristic of the photodiode 10 instead of providing a dummy photodiode for the reference voltage generation circuit 3. In this case, a resistance value of a resistance element is set to a value substantially equal to a parasitic resistance of the photodiode 10 and a capacitance of the capacitor is set to a value substantially equal to a junction capacitance of the photodiode 10.

A level shifter 14 is connected between the collector of the transistor Q2 and the current source 4 shown in FIG. 1. The level shifter 14 is a circuit formed by connecting an npn transistor Q4 in diode connection and a resistance element R5 in series. The current source 4 and a base of an npn transistor Q5, arranged as a voltage follower, are connected to one end side of the resistance element R5. For operating the transistor Q5 at a high speed, it is preferable that an amplitude change of a base voltage of the transistor Q5 be small. This is accomplished by connecting the transistor Q4 in diode connection between the other end of the resistance element R5 and the collector of the transistor Q2. With this configuration, the base voltage of the transistor Q5 is increased and hence, the transistor Q5 is thus operable at a high speed. The level shifter 14 is not always necessary, and may be omitted in some embodiments.

A capacitor C2 and a resistance element R6 are connected in parallel between the anode of the photodiode 10 and the emitter (node z1) of the transistor Q5. Most of current signal Ipd generated by the photodiode 10 flows in the resistance element R6. Accordingly, the resistance element R6 functions as a voltage converter 12 which converts a current signal Ipd generated by the photodiode 10 into a voltage, and the voltage signal obtained appears at the node z1. The capacitor C2, which is connected in parallel to the resistance element R6, provides a phase compensation capacitance and is provided to prevent oscillations of the transimpedance amplifier 2.

A stage connected to the voltage converter 12 output, includes an inverting amplifier 15 and a current source 16. The inverting amplifier 15 includes: npn transistors Q6 through Q8; resistance elements R7, R8 for determining a gain of the inverting amplifier 15; resistance elements R9 through R15; a diode-connected transistor Q9; and a capacitor C3. The inverting amplifier 15 generates a signal Vpd1 which is obtained by inverting and amplifying a voltage signal at the node z1 with a gain of R8/R7.

Next, a circuit operation of the transimpedance amplifier 2 shown in FIG. 2 is explained. When the photodiode receives an optical signal, a current signal Ipd corresponding to the optical signal is generated by the photodiode 10. An emitter current flows in the transistor Q1 corresponding to the current signal Ipd, the base voltage of the transistor Q2 is increased, and the collector voltage of the transistor Q2 is lowered. Since a constant current from the current source 4 flows in the collector of the transistor Q2, when a collector voltage of the transistor Q2 is lowered, a base voltage of the transistor Q5 is also lowered, and a voltage of the emitter (node z1) of the transistor Q5 is also lowered corresponding to the lowering of the base voltage of the transistor Q5.

Accordingly, negative feedback occurs where most current signal Ipd from the photodiode 10 flows in the resistance element R6 and an increase in the base voltage of the transistor Q1 is suppressed. When a current value of a current signal Ipd is increased to an extent such that the current value exceeds a value at which negative feedback control cannot be performed and a collector voltage (voltage of a node x1) of the transistor Q2 is lowered to some predetermined voltage level, the current signal Ipd from the photodiode 10 flows through the bypass circuit 13 so that a base current of the transistor Q1 is decreased. Accordingly, it is possible to prevent the transistors Q1, Q2 forming the initial-stage transistor circuit 11 from being brought into a saturated state so that distortion is not generated in a voltage signal Vpd1 and a pulse signal (Vout).

As described above, the diode-connected transistor Q3 in the bypass circuit 13 monitors a collector voltage of the transistor Q2. When a collector voltage of the transistor Q2 is lowered to the predetermined voltage level, the current signal Ipd from the photodiode 10 is bypassed to a bypass circuit 13 side.

The transistor Q4 in diode connection, which forms the level shifter 14, and the resistance element R5 are connected in series between the collector of the transistor Q2 and the current source 4. Due to such a configuration, a collector voltage of the transistor Q2 is lowered by an amount of (R5×I4+VBE) compared to a base voltage of the transistor Q5, where R5 indicates a resistance value of the resistance element R5, I4 indicates a collector-emitter current of the transistor Q4, and VBE indicates a base-emitter voltage of the transistor Q4.

The explanation made hereinafter assumes that all transistors in the transimpedance amplifier 2 have the same base-emitter voltage VBE. In such a case, a collector voltage (a voltage at a node x1) of the transistor Q2 changes from (2VBE−R5×I4) to VBE so that amplitude at the node x1 is (VBE−R5×I4). On the other hand, if the level shifter 14 is not provided, the amplitude at the node x1 falls within a range of 2VBE ranging from 3VBE to VBE. That is, the voltage amplitude at the node x1 may be suppressed more in the case where the level shifter 14 is provided than the case where the level shifter 14 is not provided. Accordingly, due to the provision of the level shifter 14, it is possible to shorten a recovery time of the transistor Q5.

The inverting amplifier 15 which is provided on a rear stage side within the transimpedance amplifier 2 inverts and amplifies a voltage signal (corresponding to the potential at node z1 and obtained by converting a current signal (Ipd) using the voltage converter 12) with a gain value which is obtained by dividing a resistance value of the resistance element R8 with a resistance value of the resistance element R7. The voltage converter 12 converts a current signal into a voltage signal by inverting the current signal. Accordingly, by again inverting the voltage signal by using the inverting amplifier 15, a voltage signal Vpd1 having the same direction of change as a current signal Ipd of the photodiode 10 is generated.

Although here the reference voltage generation circuit 3 is formed using the same circuit as the transimpedance amplifier 2, a photodiode included in the reference voltage generation circuit 3 can also be configured not to receive an optical signal (that is, this photodiode is effectively a dummy photodiode). Accordingly, the reference voltage generation circuit 3 generates a reference voltage signal Vdm1 corresponding to a low level (no light signal). The reference voltage signal Vdm1 will contain environmental noise such as common mode noise and noise due to irregularities in characteristics of the respective circuit elements in the reference voltage generation circuit 3.

Figure 3:
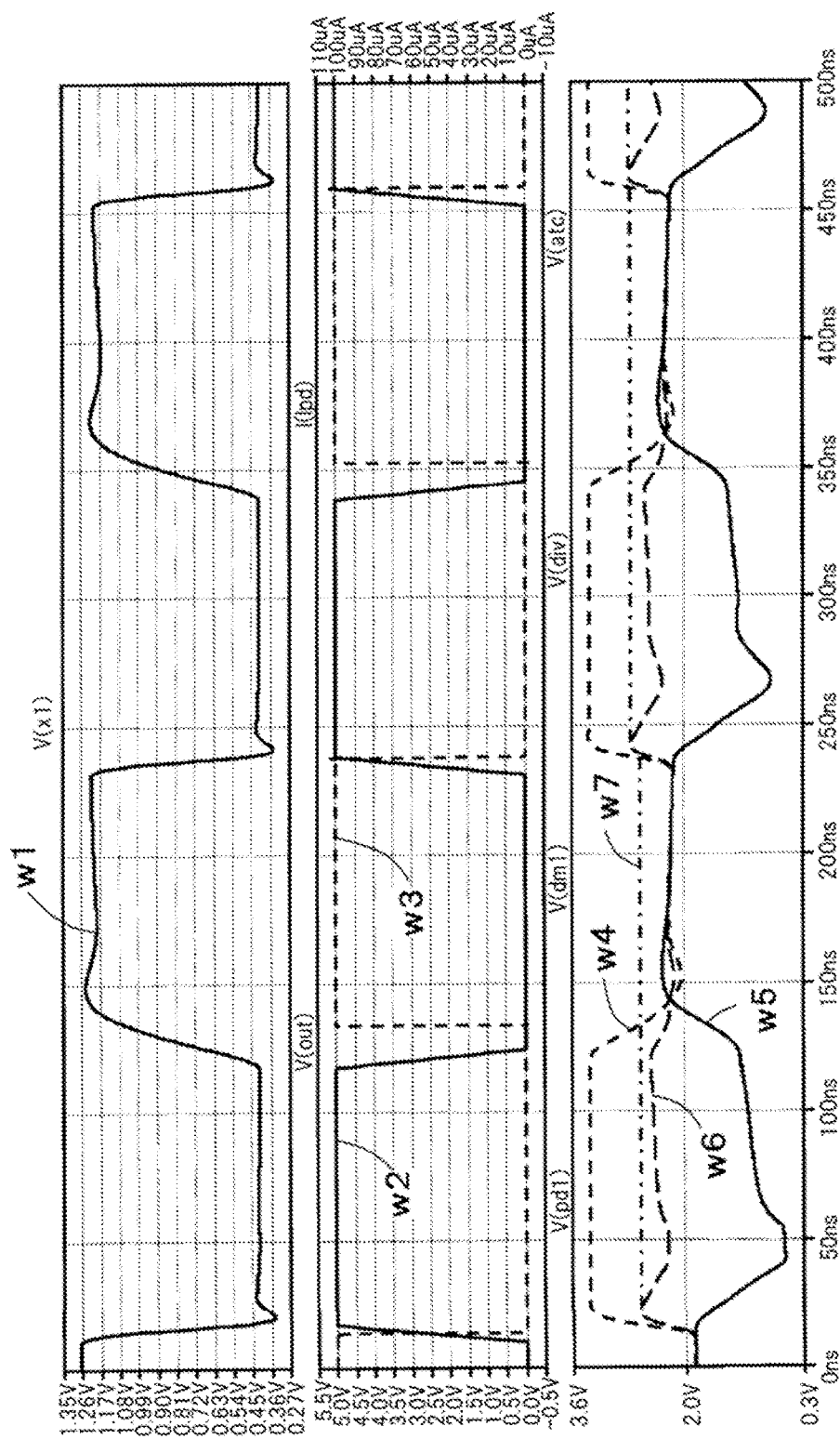
FIG. 3 depicts waveforms of voltages of respective parts in a transimpedance circuit.
Figure 4:
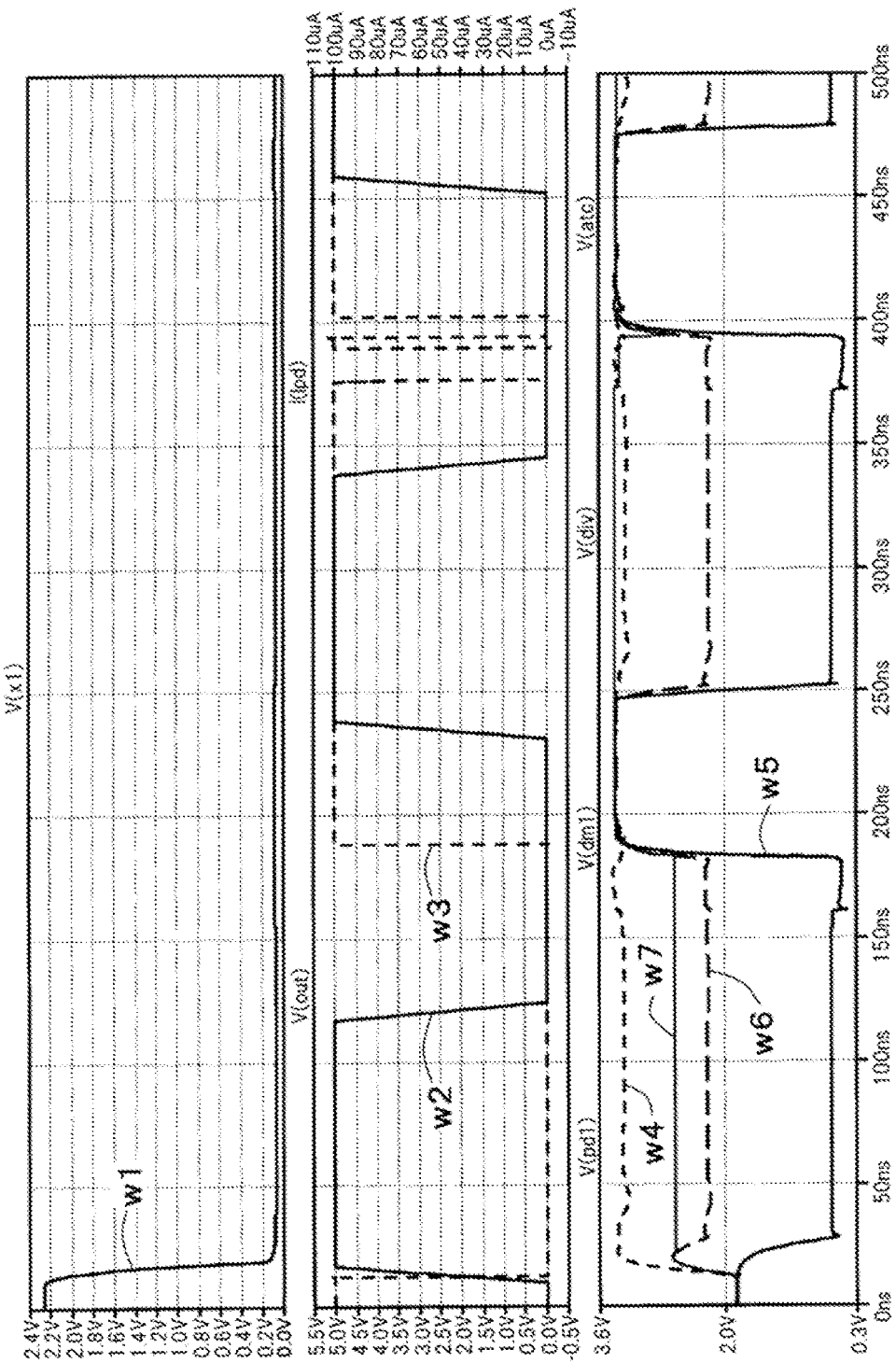
FIG. 4 depicts waveforms of voltages of respective parts in a transimpedance circuit of one comparison example lacking a bypass circuit.

FIG. 3 depicts a view showing waveforms of voltages of respective parts in the transimpedance circuit 1 in FIG. 1 and FIG. 2. FIG. 4 depicts a view showing waveforms of voltages of respective elements in a transimpedance circuit 1 according to a comparison example where the bypass circuit 13 shown in FIG. 2 is not included in the circuit.

In FIG. 3 and FIG. 4, a waveform w1 is a collector voltage waveform of the transistor Q2 in the transimpedance amplifier 2, a waveform w2 is a waveform of a current signal Ipd generated by the photodiode 10 (scale on right side), and a waveform w3 is a waveform of a pulse signal Vout generated by the transimpedance circuit 1.

In the comparative case where the bypass circuit 13 is not included in the transimpedance amplifier 2, the transistor Q2 is saturated and hence, even when a current signal Ipd is not outputted from the photodiode 10 (e.g., during times when Ipd is zero), a collector voltage of the transistor Q2 is maintained at a low voltage level (see waveform w1 in FIG. 4). To the contrary, in the case where the bypass circuit 13 is included in the transimpedance amplifier 2, when a collector voltage of the transistor Q2 is lowered, a current signal Ipd from the photodiode 10 is made to flow through the bypass circuit 13 when a predetermined level is exceeded and hence, the transistor Q2 is not saturated. Accordingly, as indicated by the waveform w1 in FIG. 3, a collector voltage of the transistor Q3 also changes in synchronization with the current signal Ipd from the photodiode 10 so that tracking of the current signal Ipd is enhanced. Further, in this embodiment, a waveform w3 of the pulse signal generated by the transimpedance circuit 1 becomes steep—that is, approaches a square wave profile. The reason that the waveform w3 becomes steep is that the bypass circuit 13 and the level shifter 14 are provided. In the comparison example, the rising edge and the falling edge of the waveform w3 of a pulse signal Vout not steep.

Further, in FIG. 3 and FIG. 4, a waveform w4 is a waveform of an output voltage Vpd1 of the transimpedance amplifier 2, a waveform w5 is a waveform of an output voltage Vdm1 of the reference voltage generation circuit 3, a waveform w6 is a waveform of an intermediate voltage Vdiv generated by the peak hold circuit 5, and a waveform w7 is a waveform of a voltage Vatc held by the peak hold circuit 5. In all waveforms w4 to w7 in this embodiment, the voltage level is changed in synchronization with a change in a current value of a current signal Ipd outputted from the photodiode 10 so that distortion in waveforms is small. On the other hand, in waveforms w4 to w7 in the comparison example (FIG. 4), a voltage level is not correctly synchronized with a change in current value of a current signal Ipd so that distortion in the waveforms is large.

Figure 5:
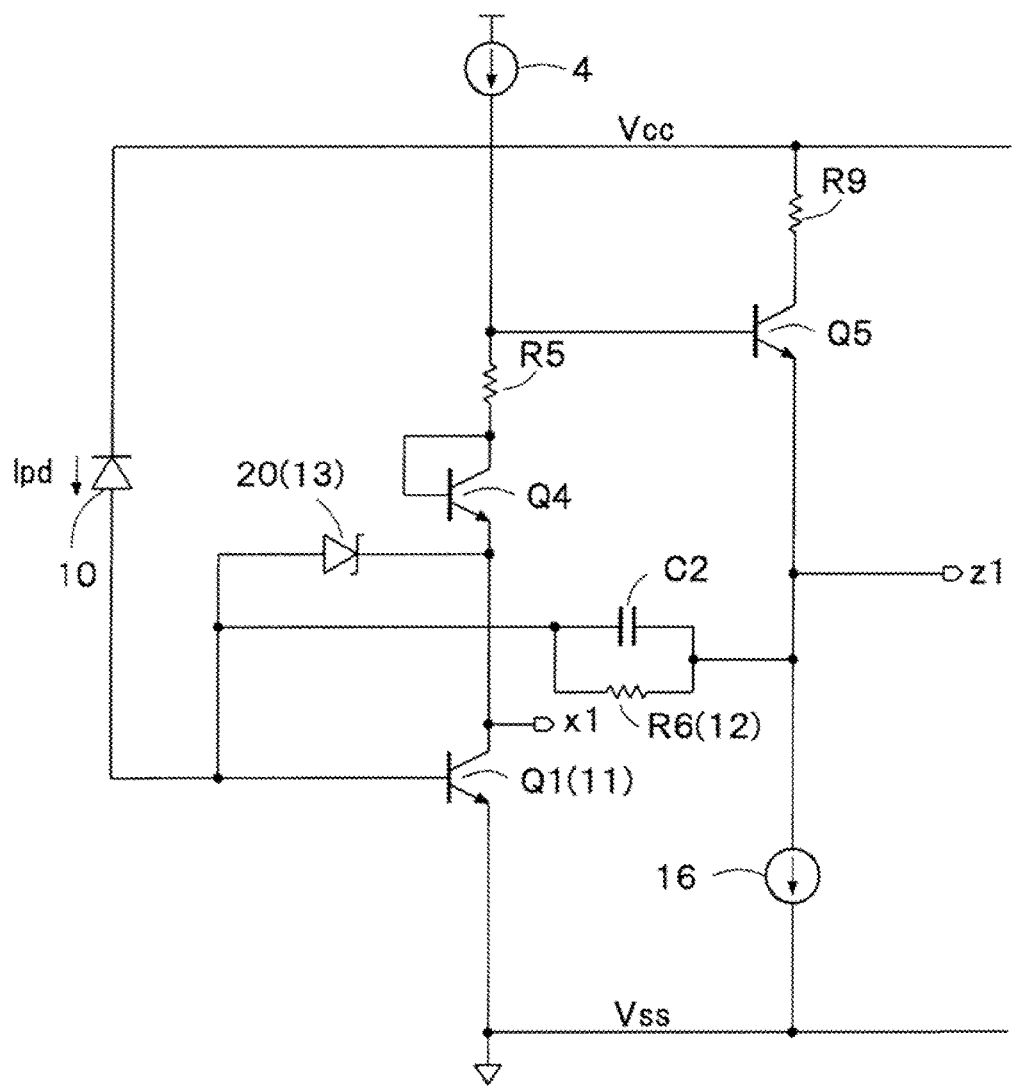
FIG. 5 depicts a circuit diagram including an emitter grounded type initial-stage transistor circuit.

In the transimpedance amplifier 2 in FIG. 2, the initial-stage transistor circuit 11 is of a collector grounded type. However, the initial-stage transistor circuit 11 may be an emitter-grounded-type transistor. FIG. 5 is a circuit diagram showing one example of the circuit configuration of the emitter-grounded-type initial-stage transistor circuit 11. The initial-stage transistor circuit 11 in FIG. 5 is one type of transistor, an npn transistor Q1. The emitter of the transistor Q1 is grounded, and the collector of the transistor Q1 is connected to the current source 4 via the npn transistor Q4 in diode connection.

The bypass circuit 13 in FIG. 5 includes a diode 20 having a forward voltage Vf of less than 0.6V (for example, about 0.3V). In one embodiment, the diode 20 in FIG. 5 is a Schottky barrier diode 20 which makes use of a Schottky barrier generated due to a bonding between a metal and a semiconductor. The Schottky barrier diode 20 has a characteristic that its forward voltage drop is low and its switching speed is high. In the bypass circuit 13 shown in FIG. 5, the resistance element R3, which is necessary in the circuit configuration shown in FIG. 2, is omitted.

The anode of the diode 20 in FIG. 5 is connected to the base of the transistor Q1 and the anode of the photodiode 10, and the cathode of the diode 20 is connected to the collector of the transistor Q1.

As described above, FIG. 2 and FIG. 5 depict an example in which a bipolar transistor is used for forming the transistors in the transimpedance amplifier 2. However, MOS transistors may be used for the transistors in the transimpedance amplifier 2.

Figure 6:
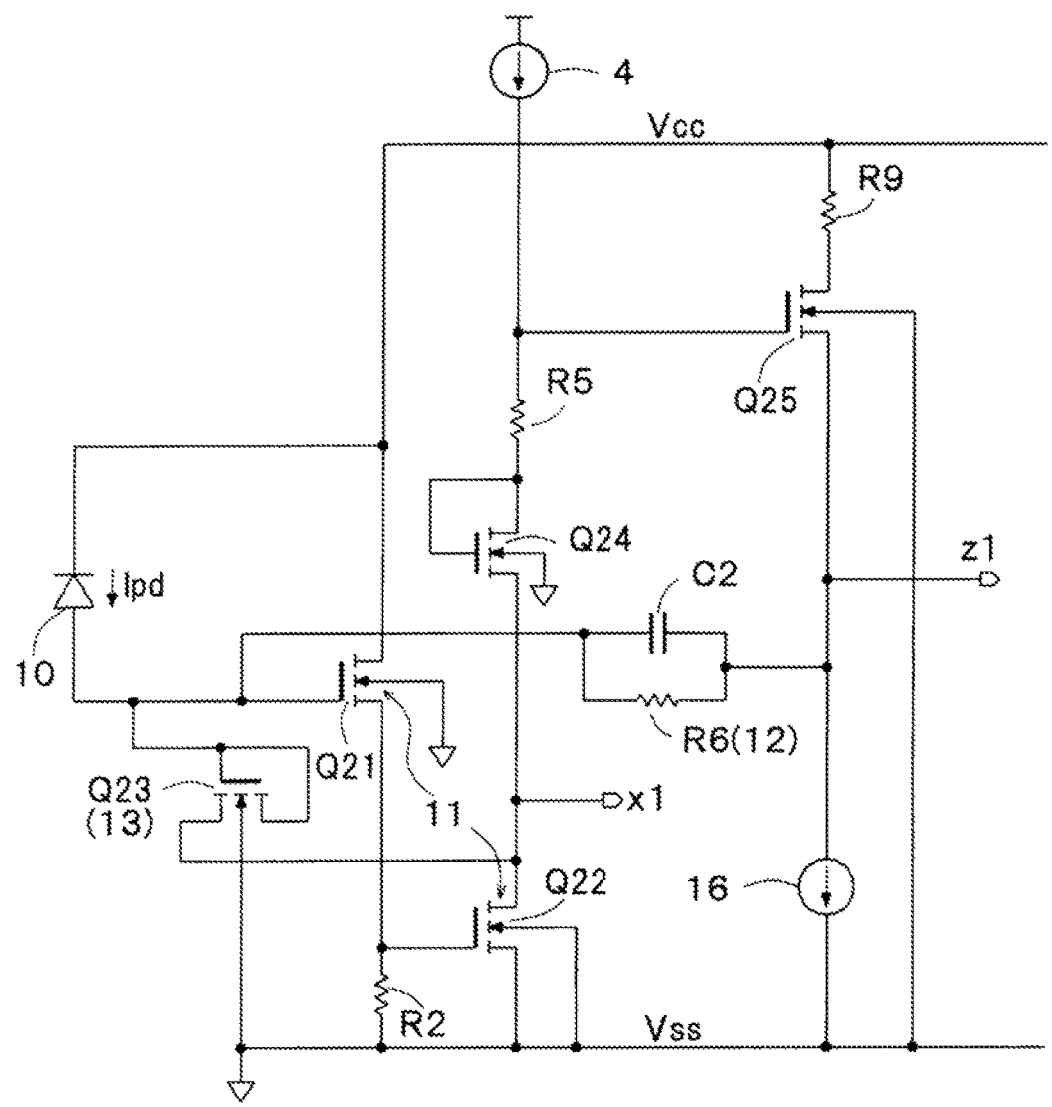
FIG. 6 depicts a circuit diagram including an initial-stage transistor circuit of a drain grounded type.
Figure 7:
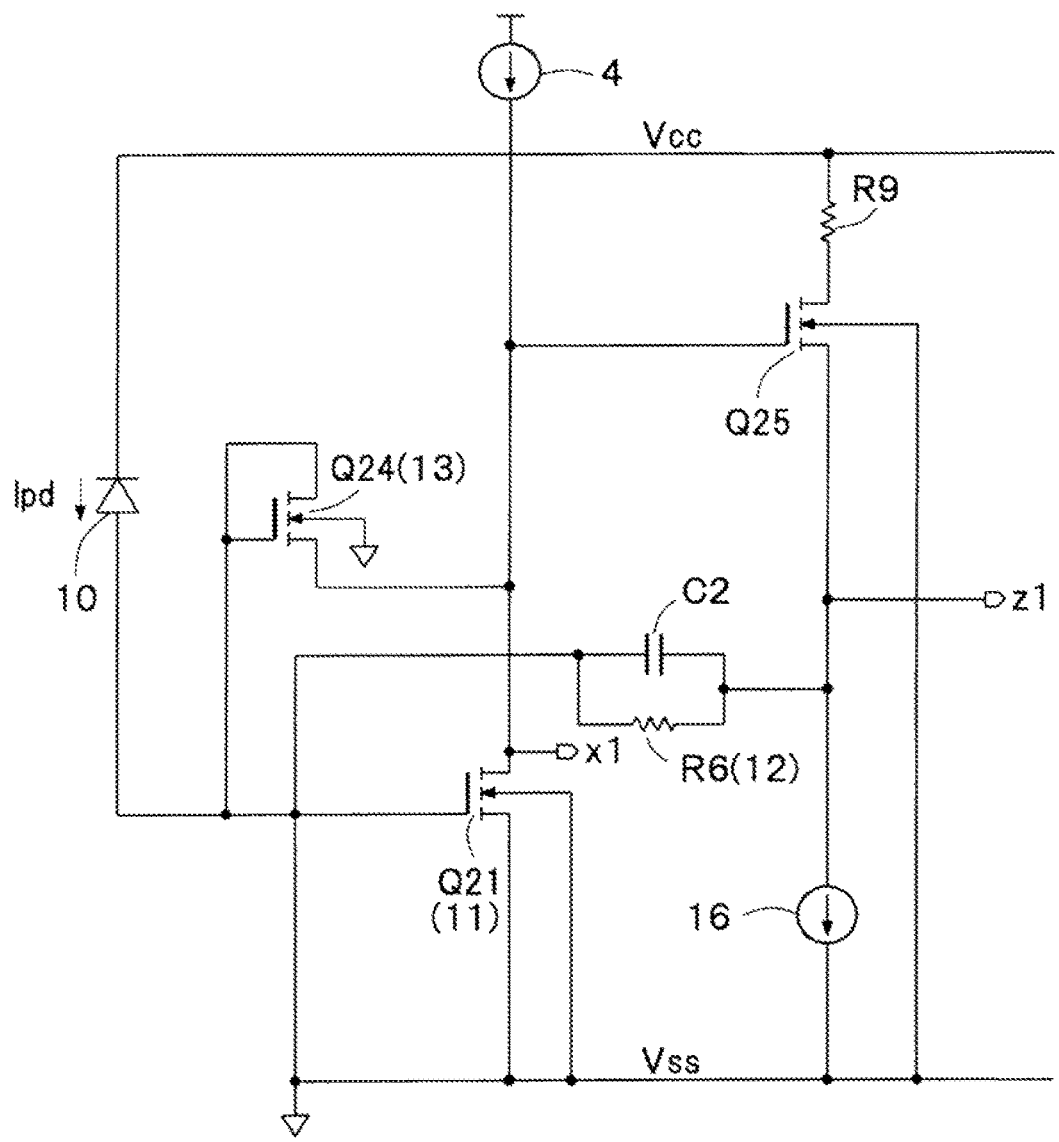
FIG. 7 depicts a circuit diagram including an initial-stage transistor circuit of a source grounded type.

FIG. 6 and FIG. 7 depict circuit diagrams showing examples in which a MOS transistor is used in the initial-stage transistor circuit 11. FIG. 6 depicts a circuit diagram showing one example where a drain-grounded-type transistor is used. FIG. 7 depicts a circuit diagram showing one example where a source-grounded-type transistor is used.

In FIG. 6 and FIG. 7, NMOS transistors are used for the respective transistors in the transimpedance amplifier 2. Hereinafter, each NMOS transistor is simply referred to as a transistor. The initial-stage transistor circuit 11 shown in FIG. 6 includes transistors Q21, Q22 which are connected in a configuration similar to a Darlington configuration. The transistor Q21 corresponds to the transistor Q1 in FIG. 2, and the transistor Q22 corresponds to the transistor Q2 in FIG. 2. In FIG. 7, similar to the circuit depicted in FIG. 5, the initial-stage transistor circuit 11 includes a single transistor Q21, which is connected as a source-grounded amplifier.

The bypass circuit 13 in FIG. 6 and FIG. 7 is formed from a single transistor (Q23 in FIG. 6 & Q24 in FIG. 7) in diode connection, and the current-limiting resistance element R3 in FIG. 2 can be omitted. The reason that the current-limiting resistance element R3 can be omitted is that an electric current which flows in a MOS transistor may be arbitrarily adjusted based on a ratio between a gate width W and a gate length L and hence, even when a resistance element is not provided, the electric current may be limited in arbitrary manner.

Further, the transistor Q23 in FIG. 6 (transistor Q24 in FIG. 7) in the bypass circuit 13 has a lower threshold value voltage than the initial-stage transistor circuit 11. Accordingly, a larger amount of electric current easily flows through the bypass circuit 13.

As described above, this example embodiment includes the bypass circuit 13 through which at least a portion of a current signal Ipd can bypass a gate/base of the initial-stage transistor circuit 11. Accordingly, the initial-stage transistor circuit 11 does not become saturated and hence, it is possible to reduce distortion of the pulse signal (Vout) generated by the transimpedance circuit 1.

By providing the level shifter 14 (e.g., Q24 and R5 in FIG. 6) on an output side of the initial-stage transistor circuit 11 in addition to the bypass circuit 13, a recovery time after the initial-stage transistor circuit 11 is turned off may be shortened so that the inverting amplifier 15 on a rear stage side may be operated at a high speed whereby a pulse signal (Vout) waveform may be made steeper.

While certain embodiments have been described, these embodiments have been presented by way of an example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A transimpedance circuit, comprising:
   a first transistor connected between a first voltage terminal and a second voltage terminal and having a control electrode connected to a current signal input node;
   a second transistor connected between a current source and the second voltage terminal and having a control electrode connected to a first electrode of the first transistor;
   a third transistor connected between the first voltage terminal and a voltage signal node and having a control electrode connected to a second electrode of the second transistor;
   a voltage conversion circuit connected between the current signal input node and the voltage signal output node; and
   a bypass circuit connected between the current signal input node and the control electrode of the third transistor, the bypass circuit comprising a diode and configured to provide a conductance pathway between the current signal input node and the control electrode of the third transistor when a level of a current signal at the current signal input node exceeds a predetermined value.

2. The transimpedance circuit according to claim 1, wherein the diode is a diode-connected transistor.

3. The transimpedance circuit according to claim 2, wherein the diode-connected transistor is a metal-oxide-semiconductor field effect transistor.

4. The transimpedance circuit according to claim 1, wherein
   the bypass circuit further comprises a resistor connected in series with the diode, and
   the diode is a diode-connected bipolar transistor.

5. The transimpedance circuit according to claim 1, further comprising:
   a fourth transistor connected between the control electrode of the third transistor and the second electrode of the second transistor, the fourth transistor being a diode-connected transistor.

6. The transimpedance circuit according to claim 1, further comprising:
   an inverting amplifier connected between the voltage signal output node and a second voltage signal output node and configured to output an inverted voltage signal corresponding to a current signal received at the current signal input node.

7. The transimpedance circuit according to claim 1, wherein the first, second, and third transistor are bipolar transistors.

8. The transimpedance circuit according to claim 1, wherein the first, second, and third transistors are metal-oxide-semiconductor field effect transistors.

* * * * *